(12) United States Patent
Sharma et al.

(10) Patent No.: US 8,284,810 B1
(45) Date of Patent: Oct. 9, 2012

(54) SOLID STATE LASER DEVICE USING A SELECTED CRYSTAL ORIENTATION IN NON-POLAR OR SEMI-POLAR GAN CONTAINING MATERIALS AND METHODS

(75) Inventors: Rajat Sharma, Goleta, CA (US); Eric M. Hall, Goleta, CA (US); Christiane Poblenz, Goleta, CA (US); Mark P. D'Evelyn, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 12/534,838

(22) Filed: Aug. 3, 2009

Related U.S. Application Data

(60) Provisional application No. 61/086,142, filed on Aug. 4, 2008.

(51) Int. Cl.
H01S 5/00 (2006.01)
(52) U.S. Cl. .................. 372/44.011; 372/43.01; 257/64; 257/E29.003; 257/E33.003
(58) Field of Classification Search ............. 372/44.011; 257/64, E29.003, E33.003
See application file for complete search history.

(56) References Cited

U.S. PATENT DOCUMENTS

| | | | |
|---|---|---|---|
| 3,245,760 A | 4/1966 | Sawyer | |
| 3,303,053 A | 2/1967 | Strong et al. | |
| 3,335,084 A | 8/1967 | Hall | |
| 4,030,966 A | 6/1977 | Hornig et al. | |
| 4,430,051 A | 2/1984 | Von Platen | |
| 5,764,674 A | 6/1998 | Hibbs-Brenner et al. | |
| 5,868,837 A | 2/1999 | DiSalvo et al. | |
| 6,090,202 A | 7/2000 | Klipov | |
| 6,129,900 A | 10/2000 | Satoh et al. | |
| 6,152,977 A | 11/2000 | D'Evelyn | |
| 6,350,191 B1 | 2/2002 | D'Evelyn et al. | |
| 6,372,002 B1 | 4/2002 | D'Evelyn et al. | |
| 6,398,867 B1 | 6/2002 | D'Evelyn et al. | |
| 6,406,776 B1 | 6/2002 | D'Evelyn | |
| 6,455,877 B1 | 9/2002 | Ogawa et al. | |
| 6,475,254 B1 | 11/2002 | Saak et al. | |
| 6,501,154 B2 | 12/2002 | Morita et al. | |
| 6,541,115 B2 | 4/2003 | Pender et al. | |
| 6,596,040 B2 | 7/2003 | Saak et al. | |
| 6,596,079 B1 | 7/2003 | Vaudo et al. | |

(Continued)

FOREIGN PATENT DOCUMENTS

JP 2005-289797 A2 10/2005

(Continued)

OTHER PUBLICATIONS

Farrell et al., "Continuous-wave Operation of AlGaN-cladding-free Nonpolar m-Plane InGaN/GaN Laser Diodes," 2007, Japanese Journal of Applied Physics, vol. 46, No. 32, pp. L761-L763.

(Continued)

Primary Examiner — Yuanda Zhang
(74) Attorney, Agent, or Firm — Kilpatrick Townsend & Stockton LLP

(57) ABSTRACT

An edge emitting solid state laser and method. The laser comprises at least one AlInGaN active layer on a bulk GaN substrate with a non-polar or semi-polar orientation. The edges of the laser comprise {1 1 –2 ±6} facets. The laser has high gain, low threshold currents, capability for extended operation at high current densities, and can be manufactured with improved yield. The laser is useful for optical data storage, projection displays, and as a source for general illumination.

22 Claims, 6 Drawing Sheets

U.S. PATENT DOCUMENTS

| | | | |
|---|---|---|---|
| 6,639,925 B2 * | 10/2003 | Niwa et al. | 372/45.01 |
| 6,656,615 B2 | 12/2003 | Dwilinski et al. | |
| 6,764,297 B2 | 7/2004 | Godwin et al. | |
| 6,765,240 B2 | 7/2004 | Tischler et al. | |
| 6,806,508 B2 | 10/2004 | D'Evelyn et al. | |
| 6,858,882 B2 * | 2/2005 | Tsuda et al. | 257/103 |
| 6,861,130 B2 | 3/2005 | D'Evelyn et al. | |
| 6,936,488 B2 | 8/2005 | D'Evelyn et al. | |
| 6,955,719 B2 | 10/2005 | Dmitriev et al. | |
| 7,009,215 B2 | 3/2006 | D'Evelyn et al. | |
| 7,026,755 B2 | 4/2006 | Setlur et al. | |
| 7,033,858 B2 | 4/2006 | Chai et al. | |
| 7,053,413 B2 | 5/2006 | D'Evelyn et al. | |
| 7,063,741 B2 | 6/2006 | D'Evelyn et al. | |
| 7,067,407 B2 | 6/2006 | Kostamo et al. | |
| 7,078,731 B2 | 7/2006 | D'Evelyn et al. | |
| 7,098,487 B2 | 8/2006 | D'Evelyn et al. | |
| 7,101,433 B2 | 9/2006 | D'Evelyn et al. | |
| 7,102,158 B2 | 9/2006 | Tysoe et al. | |
| 7,105,865 B2 | 9/2006 | Nakahata et al. | |
| 7,122,827 B2 | 10/2006 | Alizadeh et al. | |
| 7,125,453 B2 | 10/2006 | D'Evelyn et al. | |
| 7,160,388 B2 | 1/2007 | Dwilinski et al. | |
| 7,160,531 B1 | 1/2007 | Jacques et al. | |
| 7,175,704 B2 | 2/2007 | D'Evelyn et al. | |
| 7,208,393 B2 | 4/2007 | Haskell et al. | |
| 7,220,658 B2 | 5/2007 | Haskell et al. | |
| 7,291,544 B2 | 11/2007 | D'Evelyn et al. | |
| 7,316,746 B2 | 1/2008 | D'Evelyn et al. | |
| 7,329,371 B2 | 2/2008 | Setlur et al. | |
| 7,335,262 B2 | 2/2008 | Dwilinski et al. | |
| 7,338,828 B2 | 3/2008 | Imer et al. | |
| 7,341,880 B2 | 3/2008 | Erchak et al. | |
| 7,358,542 B2 | 4/2008 | Radkov et al. | |
| 7,364,619 B2 | 4/2008 | Dwilinski et al. | |
| 7,368,015 B2 | 5/2008 | D'Evelyn et al. | |
| 7,381,391 B2 | 6/2008 | Spencer et al. | |
| 7,572,425 B2 | 8/2009 | McNulty et al. | |
| 7,625,446 B2 | 12/2009 | D'Evelyn et al. | |
| 7,642,122 B2 | 1/2010 | Tysoe et al. | |
| 7,704,324 B2 | 4/2010 | D'Evelyn et al. | |
| 7,705,276 B2 | 4/2010 | Giddings et al. | |
| 7,816,238 B2 | 10/2010 | Osada et al. | |
| 2001/0011935 A1 | 8/2001 | Lee et al. | |
| 2001/0048114 A1 * | 12/2001 | Morita et al. | 257/103 |
| 2002/0105986 A1 * | 8/2002 | Yamasaki | 372/45 |
| 2002/0189532 A1 | 12/2002 | Motoki et al. | |
| 2003/0027014 A1 | 2/2003 | Johnson et al. | |
| 2003/0140845 A1 | 7/2003 | D'Evelyn et al. | |
| 2003/0145784 A1 | 8/2003 | Thompson et al. | |
| 2003/0183155 A1 | 10/2003 | D'Evelyn et al. | |
| 2003/0209191 A1 | 11/2003 | Purdy | |
| 2003/0232512 A1 | 12/2003 | Dickinson et al. | |
| 2004/0000266 A1 | 1/2004 | D'Evelyn et al. | |
| 2004/0104391 A1 | 6/2004 | Maeda et al. | |
| 2004/0161222 A1 | 8/2004 | Niida et al. | |
| 2004/0222357 A1 | 11/2004 | King et al. | |
| 2005/0098095 A1 | 5/2005 | D'Evelyn et al. | |
| 2005/0109240 A1 | 5/2005 | Maeta et al. | |
| 2005/0128469 A1 | 6/2005 | Hall et al. | |
| 2005/0191773 A1 | 9/2005 | Suzuki et al. | |
| 2005/0205215 A1 | 9/2005 | Giddings et al. | |
| 2006/0030738 A1 | 2/2006 | Vanmaele et al. | |
| 2006/0037529 A1 | 2/2006 | D'Evelyn et al. | |
| 2006/0038193 A1 | 2/2006 | Wu et al. | |
| 2006/0048699 A1 | 3/2006 | D'Evelyn et al. | |
| 2006/0096521 A1 | 5/2006 | D'Evelyn et al. | |
| 2006/0177362 A1 | 8/2006 | D'Evelyn et al. | |
| 2006/0207497 A1 | 9/2006 | D'Evelyn et al. | |
| 2006/0213429 A1 * | 9/2006 | Motoki et al. | 117/86 |
| 2006/0214287 A1 | 9/2006 | Ogihara et al. | |
| 2006/0228870 A1 | 10/2006 | Oshima | |
| 2006/0246687 A1 | 11/2006 | Kaiser et al. | |
| 2006/0255343 A1 | 11/2006 | Ogihara et al. | |
| 2006/0289386 A1 | 12/2006 | Tysoe et al. | |
| 2007/0015345 A1 | 1/2007 | Baker et al. | |
| 2007/0054476 A1 | 3/2007 | Nakahata et al. | |
| 2007/0057337 A1 | 3/2007 | Kano et al. | |
| 2007/0077674 A1 | 4/2007 | Okuyama et al. | |
| 2007/0105351 A1 | 5/2007 | Motoki et al. | |
| 2007/0141819 A1 | 6/2007 | Park et al. | |
| 2007/0142204 A1 | 6/2007 | Park et al. | |
| 2007/0151509 A1 | 7/2007 | Park | |
| 2007/0158785 A1 | 7/2007 | D'Evelyn et al. | |
| 2007/0164292 A1 | 7/2007 | Okuyama | |
| 2007/0166853 A1 | 7/2007 | Guenther et al. | |
| 2007/0178039 A1 | 8/2007 | D'Evelyn et al. | |
| 2007/0181056 A1 | 8/2007 | D'Evelyn et al. | |
| 2007/0190758 A1 | 8/2007 | Kaeding et al. | |
| 2007/0197004 A1 | 8/2007 | Dadgar et al. | |
| 2007/0210074 A1 | 9/2007 | Maurer et al. | |
| 2007/0234946 A1 | 10/2007 | Hashimoto et al. | |
| 2007/0252164 A1 | 11/2007 | Zhong et al. | |
| 2007/0274359 A1 | 11/2007 | Takeuchi et al. | |
| 2007/0290224 A1 | 12/2007 | Ogawa | |
| 2008/0008855 A1 | 1/2008 | D'Evelyn et al. | |
| 2008/0083741 A1 | 4/2008 | Giddings et al. | |
| 2008/0087919 A1 | 4/2008 | Tysoe et al. | |
| 2008/0156254 A1 | 7/2008 | Dwilinski et al. | |
| 2008/0193363 A1 | 8/2008 | Tsuji | |
| 2008/0198881 A1 * | 8/2008 | Farrell et al. | 372/9 |
| 2008/0272462 A1 | 11/2008 | Shimamoto et al. | |
| 2008/0285609 A1 * | 11/2008 | Ohta et al. | 372/44.011 |
| 2008/0298409 A1 * | 12/2008 | Yamashita et al. | 372/44.011 |
| 2009/0065798 A1 | 3/2009 | Masui et al. | |
| 2009/0072252 A1 | 3/2009 | Son et al. | |
| 2009/0092536 A1 | 4/2009 | Kawabata et al. | |
| 2009/0095973 A1 | 4/2009 | Tanaka et al. | |
| 2009/0218593 A1 | 9/2009 | Kamikawa et al. | |
| 2009/0301387 A1 | 12/2009 | D'Evelyn | |
| 2009/0301388 A1 | 12/2009 | D'Evelyn | |
| 2009/0320744 A1 | 12/2009 | D'Evelyn | |
| 2009/0320745 A1 | 12/2009 | D'Evelyn et al. | |
| 2010/0000492 A1 | 1/2010 | Ambardekar | |
| 2010/0001300 A1 | 1/2010 | Raring et al. | |
| 2010/0025656 A1 | 2/2010 | Raring et al. | |
| 2010/0031872 A1 | 2/2010 | D'Evelyn | |
| 2010/0031873 A1 | 2/2010 | D'Evelyn | |
| 2010/0031874 A1 | 2/2010 | D'Evelyn | |
| 2010/0031875 A1 | 2/2010 | D'Evelyn | |
| 2010/0031876 A1 | 2/2010 | D'Evelyn | |
| 2010/0147210 A1 | 6/2010 | D'Evelyn | |
| 2010/0148145 A1 | 6/2010 | Ishibashi et al. | |
| 2010/0151194 A1 | 6/2010 | D'Evelyn | |
| 2010/0219505 A1 | 9/2010 | D'Evelyn | |
| 2010/0295088 A1 | 11/2010 | D'Evelyn et al. | |
| 2011/0056429 A1 | 3/2011 | Raring et al. | |

FOREIGN PATENT DOCUMENTS

| | | |
|---|---|---|
| JP | 2007-039321 A | 2/2007 |
| WO | WO 2005121415 A1 | 12/2005 |

OTHER PUBLICATIONS

Feezell et al., "AlGaN-Cladding-Free Nonpolar InGaN/GaN Laser Diodes," Japanese Journal of Applied Physics, vol. 46, No. 13, pp. L284-L286.

Kojima et al., "Stimulated Emission at 474 nm from an InGaN Laser Diode Structure Grown on a (1122) GaN Substrate ," 2007, Applied Physics Letter, vol. 91, No. 25, pp. 251107-251107-3.

Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.

Okamoto et al., "Continuous-Wave Operation of m-Plane InGaN Multiple Quantum Well Laser Diodes," 2007, Japanese Journal of Applied Physics, vol. 46, No. 9, pp. L187-L189.

Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820-L822.

Schmidt et al., "Demonstration of Nonpolar m-Plane InGaN/GaN Laser Diodes ," 2007, Japanese Journal of Applied Physics, vol. 46, No. 9, L190-L191.

Sizov et al., "500-nm Optical Gain Anisotropy of Semipolar (1122) InGaN Quantum Wells," 2009, Applied Physics Express, vol. 2, pp. 071001-1-071001-3.

Tsuda et al., "Blue Laser Diodes Fabricated on *m*-Plane GaN Substrates," 2008, Applied Physics Express, vol. 1, pp. 011104-011104-03.

Tyagi et al., "Semipolar (1011) InGaN/GaN Laser Diodes on Bulk GaN Substrates," 2007, Japanese Journal of Applied Physics, vol. 46, No. 19, pp. L444-L445.

Byrappa et al., "Handbook of Hydrothermal Technology: A Technology for Crystal Growth and Materials Processing," Noyes Publications, Park Ridge, New Jersey, 2001, pp. 94-96 and 152.

Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.

D'Evelyn et al., "Bulk GaN Crystal Growth by the High-Pressure Ammonothermal Method," Journal of Crystal Growth, 2007, vol. 300, pp. 11-16.

Dwilinski et al, Ammono Method of BN, AlN, and GaN Synthesis and Crystal Growth,: Journal of Nitride Semiconductor Research, 1998, 3,25, MRS, Internet: http://nsr.mij.mrs.org.

Dwilinski et al., "Excellent Crystallinity of Truly Bulk Ammonothermal GaN," Journal of Crystal Growth, 2008, vol. 310, pp. 3911-3916.

Ehrentraut et al., "Prospects for the Ammonothermal Growth of Large GaN Crystal," Journal of Crystal Growth, 2007, vol. 305, pp. 304-310.

Frayssinet et al., "Evidence of Free Carrier Concentration Gradient Along the c-axis for Undoped GaN Single Crystals," Journal of Crystal Growth, 2001, vol. 230, pp. 442-447.

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kim et al, "Improved Electroluminescence on Nonpolar m-plane InGaN/GaN Qantum Well LEDs", 2007, Physica Status Solidi (RRL), vol. 1, No. 3, pp. 125-127.

Kolis et al., "Crystal Growth of Gallium Nitride in Supercritical Ammonia," Journal of Crystal Growth, 2001, vol. 222, pp. 431-434.

Kolis et al., "Materials Chemistry and Bulk Crystal Growth of Group III Nitrides in Supercritical Ammonia" Mat. Res. Soc. Symp. Proc., 1998, vol. 495, pp. 367-372.

Mirwald et al., "Low-Friction Cell for Piston-Cylinder High Pressure Apparatus," Journal of Geophysical Research, 1975, vol. 80, No. 11, pp. 1519-1525.

Motoki et al. "Growth and Characterization of Freestanding GaN Substrates," Journal of Crystal Growth, 2002, vol. 237-239, pp. 912-921.

Murota et al., "Solid State Light Source Fabricated with YAG:Ce Single Crystal," 2002, Japanese Journal of Applied Physics, vol. 46, No. 41, Part 2, No. 8A, pp. L887-L888.

Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.

Peters, "Ammonothermal Synthesis of Aluminium Nitride," Journal of Crystal Growth, 1999, vol. 4, pp. 411-418.

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Wang et al., "Ammonothermal Synthesis of III-Nitride Crystals," Crystal Growth & Design, 2006, vol. 6, Issue No. 6, pp. 1227-1246.

Wang et al., "Synthesis of Dense Polycrystaline GaN of High Purity by the Chemical Vapor Reaction Process," Journal of Crystal Growth, 2006, vol. 286, pp. 50-54.

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

Hashimoto et al. "Ammonothermal growth of bulk GaN," Journal of Crystal Growth 310:3907-3910 (Aug. 2008).

Hashimoto et al. "A GaN bulk crystal wit improved structural quality grown by the ammonothermal method," Nature Materials 6:568-671 (Jul. 2007).

Sarva, et al. "Dynamic compressive strength of silicon carbide under uniaxial compression," Mat. Sci. & Eng. A 317,140 (2001).

Wang et al. "Ammonothermal growth of GaN crystals in alkaline solutions," Journal of crystal Growth 287:376-380 (Jan. 2006).

Chiang et al. "Luminescent Properties of Cerium-Activated Garnet Series Phosphor: Structure and Temperature Effects," Journal of the Electrochemical Society 155:B517-B520 (2008).

Chiu et al. "Synthesis and Luminescence Properties of Intensely Red-Emitting M5Eu (WO$_4$)$_{4-x}$ (MoO$_4$)$_x$ (M = Li, Na, K) Phosphors," Journal of the Electrochemical Society 15:J71-J78 (2008).

Ci et al. "Ca$_{1-x}$Mo$_{1-y}$Nb$_y$O$_4$:Eu$_x^{3+}$ : A novel red phosphor for white light emitting diodes," Journal of Physics 152:670-674 (2008).

Happek "Development of Efficient UV-LED Phosphor Coatings for Energy Saving Solid State Lighting" University of Georgia (Jan. 2007).

Höppe et al. "Luminescence in Eu$^{2+}$-doped Ba$_2$Si$_5$ N$_8$: fluorescence, thernoliminescence, and upconversion"; Journal of Physics and Chemistry of Solids 61:2001-2006 (2000).

Li et al. "The effect of replacement of Sr by Ca on the structural and luminescence properties of the red-emitting Sr$_2$Si$_5$N$_8$:Eu$_2$+ LED conversion phosphor," Journal of Solid State Chemistry 181:515-524 (2008).

Mueller-Mach et al. "Highly efficient all-nitride phosphor-converted white light emitting diode," Physics Status Solidi (a) 202:1727-1732 (Jul. 2005).

Setlur et al. "Crystal chemistry and luminescence of Ce$^{3+}$-doped (Lu$_2$CaMg$_2$)-Ca-2(Si, Ge)$_3$O$_{12}$ and its use in LED based lighting," Chemistry of Materials 18: 3314-3322 (2006).

Wang et al. "New red Y$_{0.85}$Bi$_{0.1}$Eu$_{0.05}$V$_{1-y}$M$_y$O$_4$(M=Nb, P) phosphors for light-emitting diodes," Physica B: Condensed Matter 403:2071-2075 (Jun. 2008).

Yamamoto "White LED phosphors: the next step," Proceeding of . SPIE (2010).

Yang et al. "Preparation and luminescence properties of LED conversion novel phosphors SrZnO$_2$:Sm," Materials Letters 62:907-910 (Mar. 2008).

Haskell et al., 'Defect Reduction in (1100) m-plane gallium nitride via lateral epitaxial overgrowth by hydride vapor phase epitaxy', Applied Physics Letters 86, 111917 (2005), pp. 1-3.

PCT Communication Including Partial Search and Examination Report for PCT/US2011/41106, dated Oct. 4, 2011, 2 pages total.

International Search Report for PCT application PCT/US2011/41106 (Jan. 5, 2012).

Office action for U.S. Appl. No. 12/497,969 (Feb. 2, 2012).

Office action for U.S. Appl. No. 12/478,736 (Feb. 7, 2012).

Office action for U.S. Appl. No. 12/569,841 (Dec. 23, 2011).

Office action for U.S. Appl. No. 12/724,983 (Mar. 5, 2012).

Office action for U.S. Appl. No. 12/785,404 (Mar. 6, 2012).

* cited by examiner

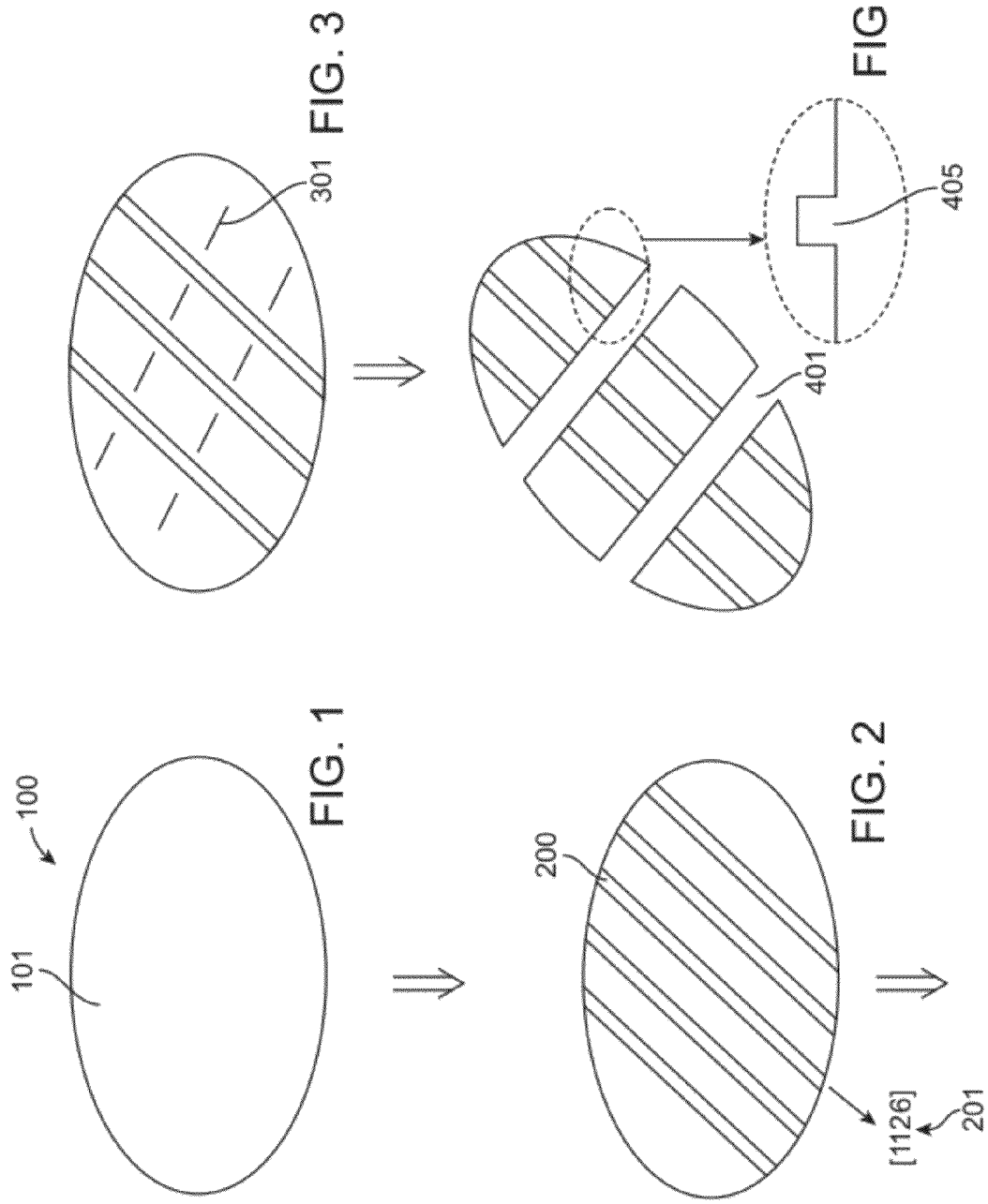

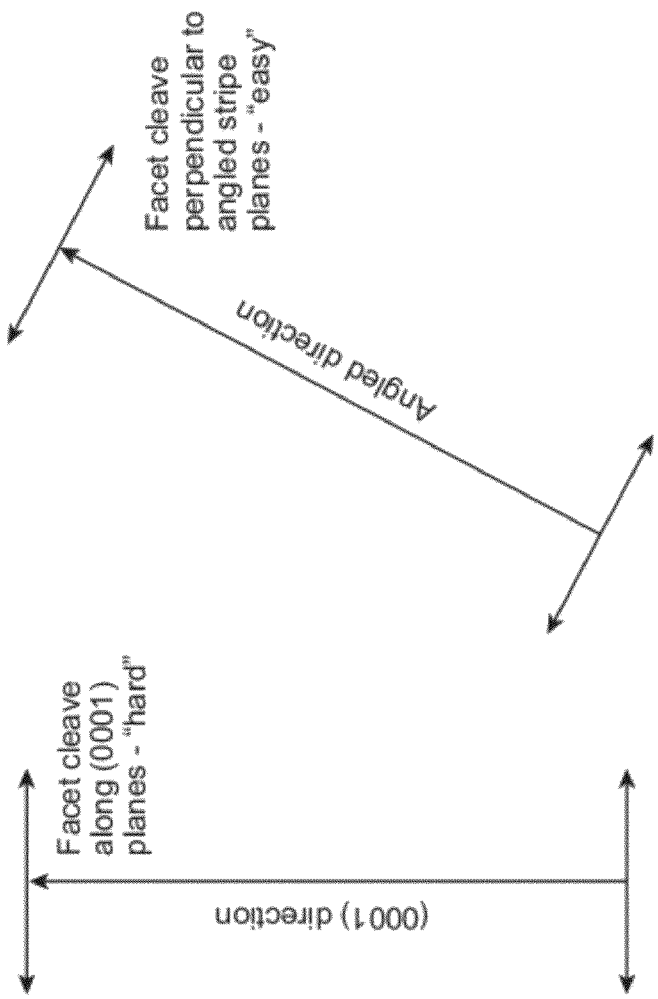
FIG. 5
FIG. 6
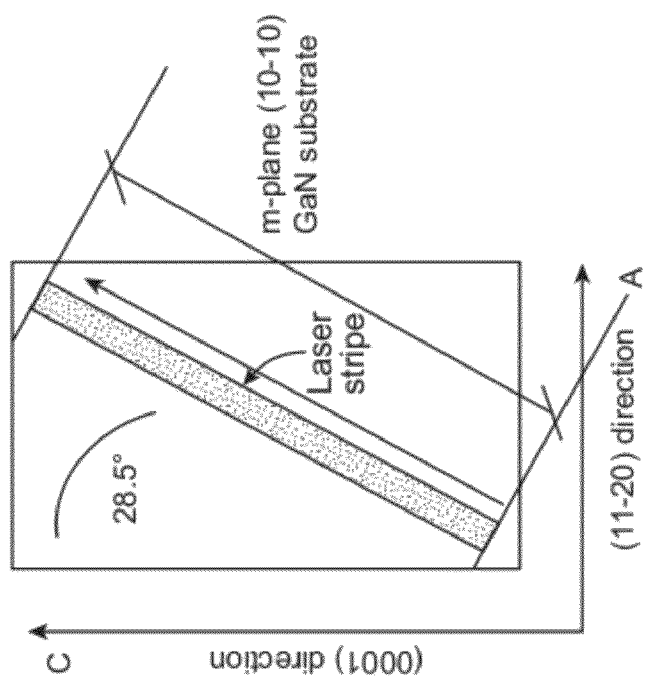
FIG. 7

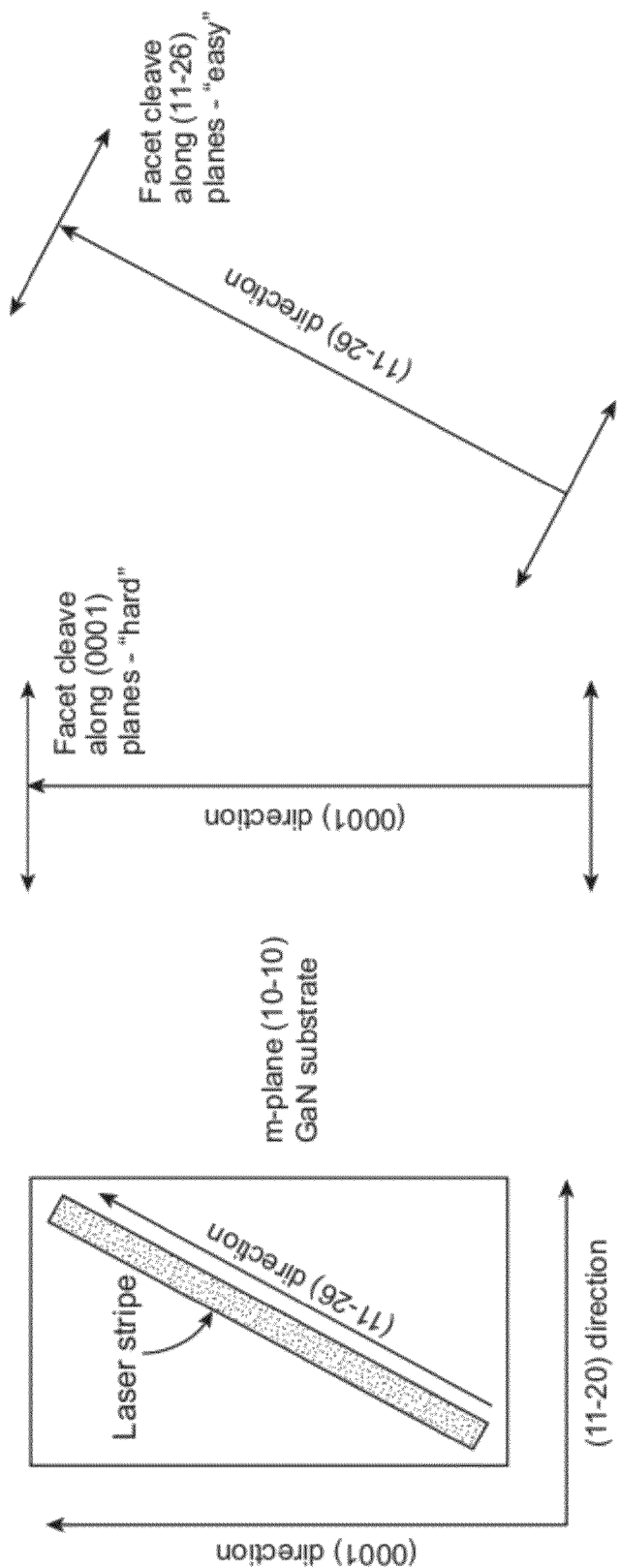

SOLID STATE LASER DEVICE USING A SELECTED CRYSTAL ORIENTATION IN NON-POLAR OR SEMI-POLAR GAN CONTAINING MATERIALS AND METHODS

CROSS-REFERENCES TO RELATED APPLICATIONS

This application claims priority to U.S. Provisional Application No. 61/086,142, filed on Aug. 4, 2008, commonly assigned, and of which is incorporated by reference in its entirety for all purpose hereby.

BACKGROUND OF THE INVENTION

The present invention relates generally to manufacture of optical devices. More particularly, the present invention provides a laser device and method using a preferred cleave orientation, which facilitates parallel facets and reduced surface roughness. Although the invention has been described in terms of cleaving, it would be recognized that other ways of forming the facet can be used. As an example, the facets can be etched, cut, separated, split, among others. Additionally, the invention can also be applied to other forms of devices such as light emitting diodes, integrated circuits, MEMS, medical devices, combination of these, among others.

Human beings have been attempting to develop new types of solid materials from the early days. From the stone-age to the electronic age, human beings have progressed through stone, brass and copper, steel, plastics, and now semiconductors. An example of a commonly used semiconductor is silicon. Silicon is used extensively in the manufacture of integrated circuits, which form the basis of electronic devices and systems, including cellular phones, computers, video games, and solar panels. Other types of semiconductor materials have also been proposed.

One such semiconductor material that has gained popularity is gallium nitride, commonly called "GaN." GaN serves as the basis of blue colored light emitting diodes, which were pioneered by a famous inventor named Shuji Nakamura. Most recently, considerable progress has been made in recent years in the fabrication of gallium nitride based laser diodes, which are useful for optical data storage, such as Blu-ray™ digital video discs, which is a trademark of the Blu-ray Disc Association. The Blu-ray disc format typically contains 5-10 times as much stored information as the predecessor DVD optical data storage format, which was based on the capabilities of red laser diodes. In addition to their usefulness for optical data storage, GaN-based laser diodes could also be extremely useful for projection displays, among other applications.

Conventional GaN-based laser diodes were fabricated on c-plane sapphire substrates, utilizing epitaxial lateral overgrowth techniques to reduce the high concentration of threading dislocations which form at the sapphire/GaN interface. The c-plane substrate orientation was utilized mainly because smooth epitaxial layers could be obtained. Later, as high quality bulk GaN substrates began to become available, laser diode manufacturers began to switch from the use of sapphire as a substrate to bulk GaN. An example of a homoepitaxial laser diode is disclosed by U.S. Pat. No. 6,936,488, which is hereby incorporated by reference in its entirety. However, for the most part, most laser diode manufacturers continued to use the c-plane orientation.

Existing methods suffer from a number of limitations. First, the efficiency of light emission in the nitrides tends to fall off markedly as the emission wavelength is increased from violet to blue, green, and beyond. Practical c-plane GaN-based laser diodes have not yet been demonstrated in green or longer wavelengths. Bright green laser diodes are needed in order to enable projection applications, in combination with blue and red laser diodes. A second limitation is that the threshold current of the devices is sometimes undesirably high, which decreases the efficiency of the devices. A third limitation is that the yield of intact devices tends to be small, mainly due to breakage during the fabrication process.

From the above, it is seen that improved techniques for developing gallium containing substrates are highly desired.

BRIEF SUMMARY OF THE INVENTION

According to the present invention, techniques for manufacture of optical devices are provided. More particularly, the present invention provides a laser device and method using a preferred cleave orientation, which facilitates parallel facets and reduced surface roughness. Although the invention has been described in terms of cleaving, it would be recognized that other ways of forming the facet can be used. As an example, the facets can be etched, cut, separated, split, among others. Additionally, the invention can also be applied to other forms of devices such as light emitting diodes, integrated circuits, MEMS, medical devices, combination of these, among others.

In a specific embodiment, the present invention provides a GaN-based laser characterized by orientation of $\{1\ 1\ -2\ \pm 6\}$ facets. The orientation, surprisingly and unexpectedly, turns out to be a preferential cleavage plane of GaN. Conventional non-polar or semi-polar GaN-based laser diodes utilized near-c-plane or a-plane facets, in some cases formed by etching rather than cleaving. We are not aware of any other wurtzite-structure semiconductor laser diodes that utilize cleaved facets with a $\{1\ 1\ -2\ \pm 6\}$ orientation except for the discovery described herein.

In a specific embodiment, the present invention provides a laser diode device. The laser diode device has a wurtzite-structure crystalline substrate, an active epitaxial layer, and end facets configured for edge emission. The end facets are within ±1 degree of a $\{1\ 1\ -2\ \pm 6\}$ crystallographic orientation and are prepared by cleaving.

In an alternative specific embodiment, the present invention provides a method of fabrication of a non-polar or semi-polar laser diode terminated by $\{1\ 1\ -2\ \pm 6\}$ facets.

In an alternative specific embodiment, the present invention provides a laser diode device. The device has a wurtzite-structure crystalline substrate containing a gallium species and an active epitaxial layer within the wurtzite-structure. The device also has at least one end facet for edge emission coupled to the active epitaxial layer, the end facet being a cleaved surface within ±5 degrees of a $\{1\ 1\ -2\ \pm 6\}$ crystallographic orientation.

In yet an alternative specific embodiment, the present invention provides a method of fabrication a non-polar or semi-polar laser diode device. The method includes providing a wurtzite-structure crystalline substrate containing a gallium species and processing a portion of the wurtzite-structure crystalline substrate to form at least one end facet characterized by a cleaved surface within ±5 degrees of a $\{1\ 1\ -2\ \pm 6\}$ crystallographic orientation.

Still further, the present invention provides an alternative laser device. The laser device has a gallium nitride or aluminum nitride containing crystalline material and a laser cavity formed within a portion of the gallium nitride or aluminum nitride containing crystalline material. In a specific embodiment, the laser cavity is characterized by a length extending from a first region to a second region. The device also has a first facet provided on the first region and a second facet provided on the second region. In a preferred embodiment, the device has an orientation of approximately 28.5 degrees from a [0001] direction of the gallium nitride or aluminum nitride containing crystalline material characterizing the direction of the length of the laser cavity.

Still further, the present invention provides an optical device comprising a wurtzite-structure crystalline substrate containing a gallium and a nitrogen species. The device also has an active epitaxial layer within the wurtzite-structure and at least one end facet for edge emission coupled to the active epitaxial layer. In a specific embodiment, the end facet is characterized by a cleaved surface within ±5 degree of a predetermined crystallographic orientation.

Moreover, the present invention provides a method of fabrication of a non-polar or semi-polar laser diode device. The method includes providing a wurtzite-structure crystalline substrate containing a gallium species and forming at least one cleaved surface within ±10 degree of a {1 1 -2 ±6} crystallographic orientation of the wurtzite-structure crystalline substrate, or other preferred crystallographic orientation.

One or more benefits may be achieved using one or more of the specific embodiments. As an example, the present device and method provides for higher yields over conventional techniques in fabricating facets for laser devices. In other embodiments, the present method and resulting structure are easier to form by way of a preferential cleaving plane in a gallium nitride containing crystalline material. In other embodiments, the present laser device has a pair of facets that are substantially parallel to each other that will provide higher efficiencies, lower optical losses, and reduced threshold currents.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIGS. 1 to 4 illustrate a method of fabricating a laser device according to an embodiment of the present invention FIGS. 5 to 7 are simplified diagrams illustrating a top-view diagram of a laser device according to an embodiment of the present invention;

FIGS. 8 to 10 are simplified diagrams illustrating a top-view diagram of an alternative laser device according to an alternative embodiment of the present invention.

DETAILED DESCRIPTION OF THE INVENTION

Figure 4:
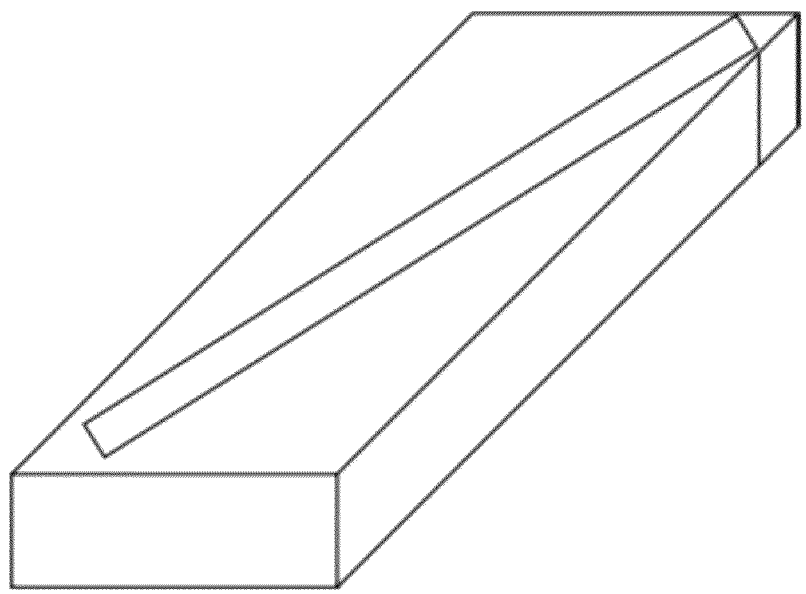

According to the present invention, techniques for manufacture of optical devices are provided. More particularly, the present invention provides a laser device and method using a preferred cleave orientation, which facilitates parallel facets and reduced surface roughness. Although the invention has been described in terms of cleaving, it would be recognized that other ways of forming the facet can be used. As an example, the facets can be etched, cut, separated, split, among others. Additionally, the invention can also be applied to other forms of devices such as light emitting diodes, integrated circuits, MEMS, medical devices, combination of these, among others.

We believe that breakthroughs in the field of GaN-based optoelectronics have demonstrated the great potential of optoelectronic devices, such as light emitting diodes (LEDs) and laser diodes, fabricated on bulk nonpolar and semipolar GaN substrates. The lack of strong polarization induced electric fields that plague conventional devices on c-plane GaN leads to a greatly enhanced radiative recombination efficiency in the light emitting InGaN layers. Furthermore, the nature of the electronic band structure and the anisotropic in-plane strain leads to highly polarized light emission, which will offer several advantages in applications such as projection displays.

Non-polar GaN substrates, in particularly, {1–100} m-plane oriented substrates, have been utilized to fabricate violet and blue laser diodes with excellent characteristics [1-7]. In all cases, the end facets of the laser diode comprised either near-c-plane or a-plane, and in a number of cases the facet was formed by etching rather than by cleaving. Typically, the threshold current in laser diodes in which the laser stripe was fabricated in the c-direction, i.e., with near-c-plane end facets, was less than the case where the laser stripe was fabricated in the a-direction. A more limited number of laser diode structures have been reported on semi-polar GaN substrates, including a violet laser diode on {1 0 -1 -1} GaN [8] and photopumped stimulated violet-to-blue-green emission on {1 1 -2 2} GaN [9].

A method for fabricating a laser device is outlined below.
1. Provide an n-type (or NID) GaN substrate;
2. Deposit a n-type GaN layer overlying the substrate;
3. Deposit an active region overlying the n-type GaN layer;
4. Deposit p-type GaN layer overlying the active region;
5. Form stripes using photolithographic and etching process;
6. Form passivation layer overlying the stripes;
7. Form contact regions through the passivation layer;
8. Form metallization layer overlying the contact regions;
9. Thin GaN substrate to desired thickness;
10. Scribe facet regions for each of the stripes along preferred crystal orientation;
11. Separate each of the stripes; and
12. Perform other steps, as desired.

The above sequence of steps provides a method according to an embodiment of the present invention. In a specific embodiment, the present invention provides a method and device for preferential cleaving to form cleaved facet regions for laser devices. Other alternatives can also be provided where steps are added, one or more steps are removed, or one or more steps are provided in a different sequence without departing from the scope of the claims herein.

FIGS. 1 to 4 illustrate a method of fabricating a laser device according to an embodiment of the present invention. As shown, a non-polar or semi-polar laser diode may be fabricated on a bulk gallium nitride substrate 100. As shown, the bulk gallium nitride has surface region 101. Gallium nitride is a hexagonal, wurtzite-structure crystal (space group P63mc; point group 6 mm) with distinct growth sectors. The gallium nitride substrate may be sliced from a boule that was grown by hydride vapor phase epitaxy or ammonothermally, according to methods known in the art. In a specific embodiment, the gallium nitride substrate is fabricated by a combination of hydride vapor phase epitaxy and ammonothermal growth, as disclosed in U.S. Patent Application No. 61/078,704, commonly assigned, and hereby incorporated by reference herein. The boule may be grown in the c-direction, the m-direction, the a-direction, or in a semi-polar direction on a single-crystal seed crystal. The gallium nitride substrate may be cut, lapped, polished, and chemical-mechanically polished. The gallium nitride substrate orientation may be within ±5 degrees, ±2 degrees, ±1 degree, or ±0.5 degrees of the non-polar {1 –1 0 0} m plane, of the semi-polar {8 0 –8 ±7} plane, or of the semi-polar {4 4 –8 ±7} plane. The latter two semi-polar planes are tilted, by approximately 3 degrees, with respect to the semi-polar {1 0 –1 ±1} and {1 1 –2 ±2} planes, respectively. The gallium nitride substrate may have a dislocation density in the plane of the large-area surface that is less than 106 cm-2, less than 105 cm-2, less than 104 cm-2, or less than 103 cm-2. The gallium nitride substrate may have a dislocation density in the c plane that is less than 106 cm-2, less than 105 cm-2, less than 104 cm-2, or less than 103 cm-2.

A homoepitaxial non-polar or semi-polar laser diode is fabricated on the gallium nitride substrate according to methods that are known in the art, for example, following the methods disclosed in U.S. Pat. No. 7,053,413, which is hereby incorporated by reference in its entirety. At least one $Al_xIn_yGa_{1-x-y}N$ layer, where $0 \leq x \leq 1$, $0 \leq y \leq 1$, and $0 \leq x+y \leq 1$, is deposited on the substrate, for example, following the methods disclosed by U.S. Pat. Nos. 7,338,828 and 7,220,324, which are hereby incorporated by reference in their entirety. The at least one $Al_xIn_yGa_{1-x-y}N$ layer may be deposited by metal-organic chemical vapor deposition, by molecular beam epitaxy, by hydride vapor phase epitaxy, or by a combination thereof. In a specific embodiment, the device comprises an active layer that preferentially emits light when an electrical current is passed through it. In one specific embodiment, the active layer comprises a single quantum well, with a thickness between about 1 nm and about 30 nm. In a specific embodiment, the active layer comprises a single quantum well with a thickness between about 1 nm and about 5 nm. In other embodiments, the active layer comprises a single quantum well with a thickness between about 5 nm and about 10 nm, between about 10 nm and about 15 nm, between about 15 nm and about 20 nm, between about 20 nm and about 25 nm, between about 25 nm and about 30 nm, between about 30 nm and about 35 nm, or between about 35 nm and about 40 nm. In another set of embodiments, the active layer comprises a multiple quantum well. In one specific embodiment, the active layer comprises an $In_yGa_{1-y}N$ layer, where $0 \leq y \leq 1$.

In some embodiments, the device includes an $Al_xGa_{1-x}N$ cladding layer, where $0 \leq x \leq 1$. In other embodiments, the device structure may include $Al_xGa_{1-x}N$ electron-blocking layers but is free of $Al_xGa_{1-x}N$ cladding layers. In some embodiments the light guiding layers comprise GaN. In other embodiments, to enhance the contrast in refractive index between layers, the light guiding layers may comprise $In_yGa_{1-y}N$ layer, where $0 \leq y \leq 1$.

After completion of the deposition of epitaxial nitride layers, the device is masked and lithographically etched to form a stripe or plurality of stripes 200. In a preferred embodiment, the stripe side walls are approximately perpendicular to the (1 1 –2 ±6) plane 201. In a specific embodiment, the masking occurs using a photoresist mask, such as those manufactured by Clairiant Corporation or the Shipley Company. In a specific embodiment, etching occurs using a reactive ion or plasma etch using a chlorine species to form each of the plurality of stripes. In a specific embodiment, each of the stripes can have a width of about 0.25 micron to about 10 microns. In another embodiment, each of the stripes can have a width of about 1 micron to about 2 microns, but there can be others. Each of the stripes can also have a length ranging from about 200 microns to about 1 millimeter. As shown, each of the stripes extends from a vicinity of a first edge of the substrate to a second edge the substrate.

In a specific embodiment, the present method includes a metallization process to form interconnects for the laser diodes. The metallization can be formed using a masking and etching process. The metallization can be any suitable material such as gold, palladium, platinum, nickel, titanium, aluminum, and others. In a specific embodiment, the metalized device is covered using a dielectric layer or layers such as silicon dioxide, silicon nitride, or any combination of these materials.

Following metallization, the laser diodes are formed by cleaving along the {1 1 –2 6} plane, as shown. That is, the method forms one or more scribe lines 301, which are formed in regions that correspond to facets of the laser devices. In a specific embodiment, each of the laser devices includes a pair of facets, which will be substantially parallel to each other. Scribing can occur using a variety of techniques such as mechanical scribing, laser scribing, chemical scribing, and others.

In a preferred embodiment, the method uses a laser scribing process. In a specific embodiment, the present invention scribes a portion of a gallium nitride substrate using a beam of light from a laser source. The laser source can have a suitable power, such as a range of about 200 milliwatts to about 1.5 Watts, but can be others. In a specific embodiment, the beam is characterized by a spot size ranging from about 1 to 20 microns. As merely an example, the laser source is solid state laser using $Nd:YVO_4$, among others.

In a specific embodiment, the method further comprises mechanically cleaving the scribed region to free 401 the facet characterized by the cleaved surface, as illustrated in FIG. 4. In a specific embodiment, the method introduces energy into the scribed region to free the facet characterized by the cleaved surface. As shown by reference numeral 405, a cleaved facet characterized by a root-mean-square surface roughness less than about 1 nm over a 25 micron square area, but can be others.

FIGS. 5 to 7 are simplified diagrams illustrating a top-view diagram of a laser device 500 according to an embodiment of the present invention. As shown is an edge-emitting laser device wherein the laser cavity is oriented approximately 28.5 degrees from the [0001] direction of the GaN crystal according to a specific embodiment. As noted, we discovered that a conventional edge-emitting laser device has challenging engineering problems. That is, it is often difficult to form smooth, parallel cleaved facets. For laser devices on m-plane GaN, the preferred stripe orientation 503 is along the c-direction. Unfortunately, cleaving along c-plane GaN is non-trivial and has limitations. In a preferred embodiment, the plane in GaN perpendicular to the angled strip direction 505 may be a preferred cleave plane, which is easier to cleave than along the c-plane, as shown by our preliminary experiments. Therefore, a laser cavity oriented along this angled direction on m-plane GaN, which is at an angle of 28.5°+/–5° to the [0001] c-direction in GaN, may be preferred to a cavity oriented over the [0001] direction, and result in an improved process yield during the cleaving step.

FIGS. 8 to 10 are simplified diagrams illustrating a top-view diagram of an alternative laser device 800 according to an alternative embodiment of the present invention. As shown, is an edge-emitting laser device according to an alternative embodiment. The laser cavity is oriented approximately perpendicularly to the {11–26} plane of the GaN crystal, as shown by a length extending perpendicular to the {11–26} plane. As noted, we discovered that the {11–26} plane in GaN is a preferred cleave plane, as shown by preliminary experiments. Therefore, a laser cavity oriented perpendicular to the {11–26} plane on m-plane GaN, which is at an angle of roughly 28.5° to the [0001] c-direction in GaN, may be preferred to a cavity oriented along the [0001] direction, and may result in an improved process yield during the cleaving step. Similarly, a laser cavity oriented perpendicular to the {11–26} plane on semi-polar GaN, with a large-area surface orientation of {8 0 –8 ±7}, {4 4 –8 ±7}, {1 0 –1 ±1}, or {1 1 –2 ±2}, which is at an angle of roughly 28.5° to the [0001] c-direction in GaN, may be preferred to a cavity oriented along the projection of the (0001) direction on the semi-polar surface, and may result in an improved process yield during the cleaving step. Of course, there can be other variations, modifications, and alternatives.

Although the above has been described in terms of specific embodiments, there can be other variations, modifications, and alternatives. In an alternative specific embodiment, the orientation can also vary slightly or substantially. In a specific embodiment, the wurtzite-structure crystalline substrate is within ±5 degrees of the non-polar {1–100} m plane. Alternatively, the wurtzite-structure crystalline substrate is within ±5 degrees of the semi-polar {8 0 –8 ±7} plane. Alternatively, the orientation of the wurtzite-structure crystalline substrate is within ±5 degrees of the semi-polar {4 4 –8 ±7} plane. Alternatively, the wurtzite-structure crystalline substrate comprises gallium and nitrogen. In other embodiments, the active epitaxial layer comprises a single quantum well with a thickness between about 1 and about 30 nanometers. In other embodiments, the active epitaxial layer comprises a single quantum well with a thickness between about 5 and about 15 nanometers and other embodiments include a multiple quantum well. In a specific embodiment, each quantum well has a layer thickness between about 1 and about 30 nanometers. In other embodiments, the active epitaxial layer comprises a multiple quantum well. Each quantum well has a layer thickness between about 5 and about 15 nanometers according to a specific embodiment. Alternatively, the device structure is free of AlGaN cladding layers. In other embodiments, the device structure comprises guiding layers comprising InGaN. Of course, there can be other variations, modifications, and alternatives.

The above sequence of steps provides a method according to an embodiment of the present invention. In a specific embodiment, the present invention provides a method and device for preferential cleaving to form cleaved facet regions for laser devices. Other alternatives can also be provided where steps are added, one or more steps are removed, or one or more steps are provided in a different sequence without departing from the scope of the claims herein.

EXAMPLES

Figure 11:
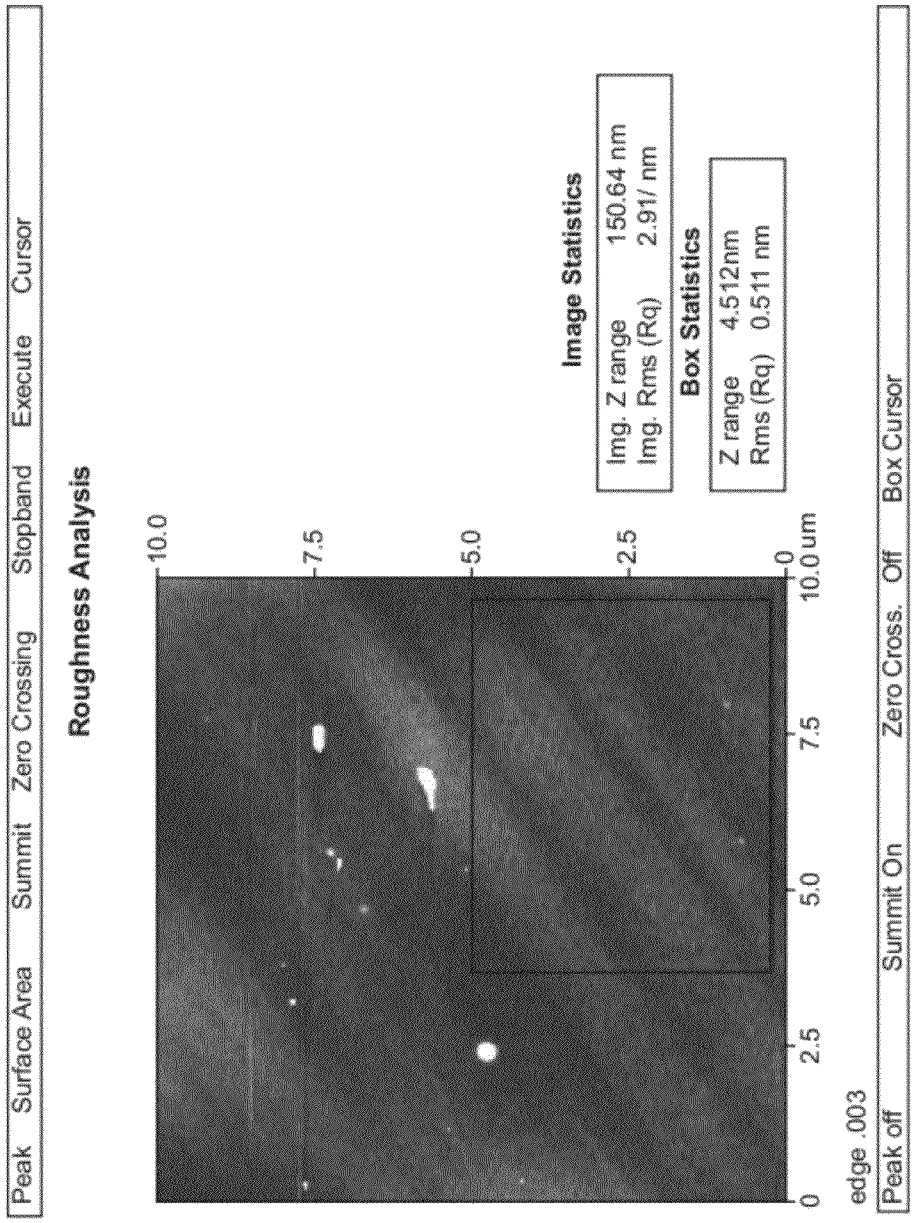
FIGS. 11 through 12 are top-view photographs of AFM images of experiment results according to embodiments of the present invention.
Figure 12:
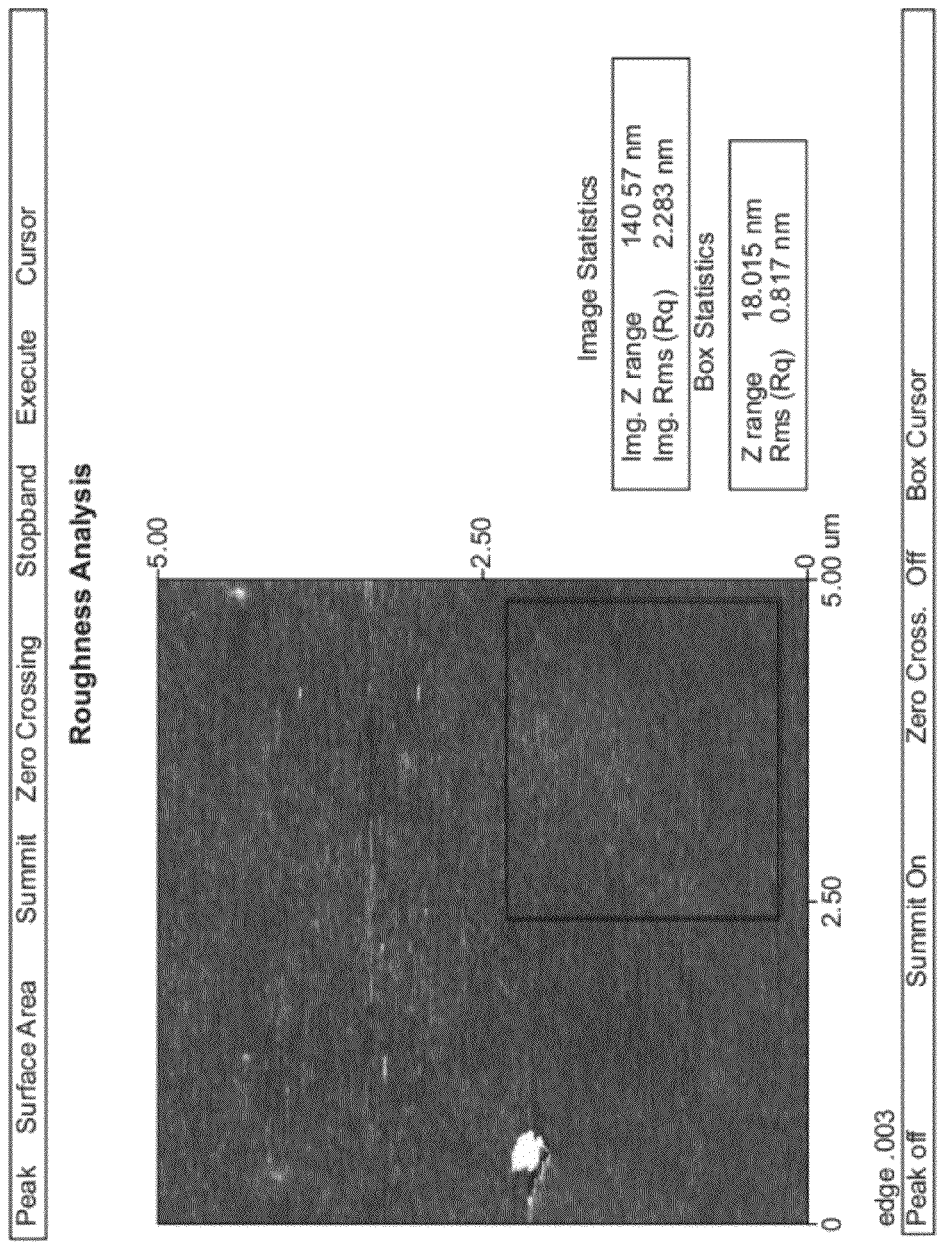

To prove the principle and operation of the present invention, we performed experiments using GaN substrate materials. In our experiment, we used m-plane GaN crystalline substrates manufactured by Mitsubishi Chemical Corporation, although other commercially available substrates are believed to also work. Details of the present experiments are provided by reference to FIGS. 11 through 12, which are top-view photographs of AFM images of experiment results according to embodiments of the present invention. These photographs are not intended to be limiting. As shown, the photographs illustrate a substantially smooth facet surface, which cleaved preferentially.

We discovered a certain plane or planes of a GaN crystalline material that cleaves preferentially to achieve substantially planar faces and desired surface roughness characteristics. In an attempt to prepare a c-plane-oriented cleavage surface on an m-plane, bulk GaN crystal, a series of interrupted laser scribe marks were placed on one m-plane surface parallel to the c plane of the crystal. The substrate crystal was then cleaved. Surprisingly, a number of very straight cleavage lines were formed at an oblique angle to the c plane. The cleavage plane was accurately perpendicular to the m-plane. The angle between the cleavage plane and the c-plane was measured to be 28.5 degrees, precisely the angle between (0001) and (1 1 –2 6). The surface roughness of the cleaved surface was measured by atomic force microscopy over an area of about 25 square microns to be approximately 0.5 nm RMS, and possibly even less.

The observation that the {1 1 –2 6} family of planes is a preferential cleavage plane in GaN is quite surprising. The easiest cleavage family of planes, {1–100}, or m plane, has an atomic structure with closely packed atoms, that is, a high surface atomic number density, and low Miller indices. The cleavage planes in other semiconductor materials, e.g., silicon (111) or gallium arsenide (110), similarly have a high surface atomic number density and low Miller indices. By contrast, the (1 1 –2 6) surface, or at least the idealized bulk termination of this surface, has a significantly lower atomic number density and high Miller indices.

The use of the (1 1 –2 6) planes for the end facets of the laser diodes has at least two advantages: (i) easy cleavage, increasing device yields; and (ii) orientation of the stripe in a direction that is close to (within about 30 degrees) of the c-direction, which takes advantage of the increased optical gain and thereby reduced threshold current in this direction. As shown, our experiments proved the operation of the present method and devices.

As used herein, certain terms should be interpreted by ordinary meaning known by one of ordinary skill in the art. As an example, the term "wurtzite structure" can be a crystal structure member of the hexagonal crystal system. In a preferred embodiment, the wurtzite structure is a gallium nitride containing crystalline material, commonly called "GaN" as used herein and outside of the present specification. In one or more specific embodiments, the wurtzite structure is characterized by tetrahedrally coordinated zinc and sulfur atoms that are stacked in an ABABAB pattern. As an example, the ZnS wurtzite structure is closely related to the structure of lonsdaleite, or hexagonal diamond, but can be others. In one or more examples, other compounds can take the wurtzite structure, including AgI, ZnO, CdS, CdSe, 2H—SiC, GaN, AlN, and other semiconductors. As noted, the present method can be used in a variety of applications outside those in the optical field and can generally be used for scribing and breaking and/or separating techniques for one or more of the materials described herein.

In a specific embodiment, the present method and devices can be formed on or from bulk crystalline GaN substrate materials. The bulk GaN materials can be associated with any Group III-nitride based materials including GaN, InGaN, AlGaN, or other Group III containing alloys or compositions that are used as starting materials. Such starting materials include polar GaN substrates (i.e., substrates where the largest area surface is nominally an (h k i l) plane wherein h=k=i=0, and l is non-zero), non-polar GaN substrates (i.e., substrate material where the largest area surface is oriented at an angle ranging from about 80-100 degrees from the polar orientation described above towards an (h k i l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k i l) plane wherein l=0, and at least one of h and k is non-zero) according to one or more embodiments.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A laser diode device comprising:
    a wurtzite-structure crystalline substrate containing a gallium species;
    an active epitaxial layer within the wurtzite-structure; and
    at least one end facet for edge emission coupled to the active epitaxial layer, the end facet being a cleaved surface within ±5 degrees of a {1 1 –2 6} or a {1 1 –2 –6} crystallographic orientation;
    wherein the orientation of the wurtzite-structure crystalline substrate is within ±5 degrees of a {8 0 –8 7} plane, a {8 0 –8 –7} plane, a {4 4 –8 7} plane, or a {4 4 –8 –7} plane.

2. The laser diode device of claim 1, wherein the wurtzite-structure crystalline substrate comprises the gallium species and a nitrogen species.

3. The laser diode device of claim 1, wherein the active epitaxial layer comprises a single quantum well with a thickness between about 1 and about 30 nanometers.

4. The laser diode device of claim 3, wherein the active epitaxial layer comprises a single quantum well with a thickness between about 5 and about 15 nanometers.

5. The laser diode device of claim 1, wherein the active epitaxial layer comprises a multiple quantum well, wherein each quantum well has a layer thickness between about 1 and about 30 nanometers.

6. The laser diode device of claim 5, wherein the active epitaxial layer comprises a multiple quantum well, wherein each quantum well has a layer thickness between about 5 and about 15 nanometers.

7. The laser diode device of claim 2, wherein the device structure is free of AlGaN cladding layers.

8. The laser diode device of claim 2, wherein the device structure comprises guiding layers comprising InGaN.

9. The laser diode device of claim 1, wherein the cleaved facet is characterized by a root-mean-square surface roughness less than about 1 nm.

10. The laser diode device of claim 9, wherein the cleaved facet is characterized by a root-mean-square surface roughness less than about 0.5 nm.

11. The laser diode device of claim 9, wherein the cleaved facet is characterized by a root-mean-square surface roughness less than about 0.2 nm.

12. The laser diode device of claim 9, wherein the cleaved facet is characterized by a root-mean-square surface roughness less than about 0.1 nm.

13. The laser diode device of claim 9, wherein the cleaved facet is characterized by a root-mean-square surface roughness less than about 0.05 nm.

14. A laser device comprising:
    a gallium nitride or aluminum nitride containing crystalline material;
    a laser cavity formed within a portion of the gallium nitride or aluminum nitride containing crystalline material, the laser cavity being characterized by a length extending from a first end to a second opposite end;
    a first facet provided on the first end;
    a second facet provided on the second end;
    wherein the length of the laser cavity is along a direction that is approximately 28.5 degrees from a [0001] direction of the gallium nitride or aluminum nitride containing crystalline material.

15. The device of claim 14 wherein the gallium nitride containing crystalline material is gallium nitride.

16. The device of claim 14 wherein the aluminum nitride containing crystalline material is aluminum nitride.

17. The device of claim 14 wherein the gallium nitride containing crystalline material is aluminum gallium nitride.

18. The device of claim 14 wherein the orientation of the first facet and the second facet is within ±5 degrees of a {1 1 –2 6} or a {1 1 –2 –6} crystallographic plane of the gallium nitride or aluminum nitride containing crystalline material.

19. The device of claim 14 further comprising an active region within the laser cavity.

20. The device of claim 14 wherein the first facet is substantially parallel to the second facet.

21. A semiconductor crystalline device comprising:
    a wurtzite-structure crystalline substrate with a surface orientation being within ±5 degrees of a {8 0 –8 7} plane, a {8 0 –8 –7} plane, a {4 4 –8 7} plane, or a {4 4 –8 –7} plane;
    an epitaxial layer within the wurtzite structure; and
    at least one end facet coupled to the active epitaxial layer, the end facet being a cleaved surface within ±5 degrees of a {1 1 –2 6} or a {1 1 –2 –6} crystallographic orientation.

22. The device of claim 21, wherein the wurtzite structure comprises at least one of ZnS, AgI, ZnO, CdS, CdSe, and 2H—SiC.

* * * * *